US008812927B2

(12) United States Patent
Maeda et al.

(10) Patent No.: US 8,812,927 B2
(45) Date of Patent: Aug. 19, 2014

(54) DECODING DEVICE, DECODING METHOD, AND PROGRAM FOR GENERATING A SUBSTITUTE SIGNAL WHEN AN ERROR HAS OCCURRED DURING DECODING

(75) Inventors: Yuuji Maeda, Tokyo (JP); Jun Matsumoto, Kanagawa (JP); Yasuhiro Toguri, Kanagawa (JP); Shiro Suzuki, Kanagawa (JP); Yuuki Matsumura, Saitama (JP)

(73) Assignee: Sony Corporation, Tokyo (JP)

( * ) Notice: Subject to any disclaimer, the term of this patent is extended or adjusted under 35 U.S.C. 154(b) by 357 days.

(21) Appl. No.: 13/301,542

(22) Filed: Nov. 21, 2011

(65) Prior Publication Data

US 2012/0137191 A1 May 31, 2012

(30) Foreign Application Priority Data

Nov. 26, 2010 (JP) ................................ P2010-263807

(51) Int. Cl.

*H03M 13/00* (2006.01)
*H04J 11/00* (2006.01)
*H04L 27/00* (2006.01)

(52) U.S. Cl.

USPC ........... 714/752; 714/776; 370/208; 375/260; 375/274; 375/305

(58) Field of Classification Search

USPC ........... 714/752, 776; 370/208; 375/260, 274, 375/305; 704/204

See application file for complete search history.

(56) References Cited

U.S. PATENT DOCUMENTS

| | | | | |
|---|---|---|---|---|
| 5,765,127 | A * | 6/1998 | Nishiguchi et al. | 704/208 |
| 8,078,456 | B2 * | 12/2011 | Chen et al. | 704/218 |
| 8,346,546 | B2 * | 1/2013 | Chen | 704/228 |
| 8,576,946 | B2 * | 11/2013 | Chugg et al. | 375/299 |
| 2005/0170313 | A1 | 8/2005 | Pitz et al. | |
| 2006/0167693 | A1 | 7/2006 | Kapilow | |

FOREIGN PATENT DOCUMENTS

| | | |
|---|---|---|
| JP | 2002-542518 | 12/2002 |
| JP | 2002-542519 | 12/2002 |

OTHER PUBLICATIONS

Sankaranarayanan, S.; Vasic, B., “Iterative Decoding of Linear Block Codes: A Parity-Check Orthogonalization Approach,” Information Theory, IEEE Transactions on , vol. 51, No. 9, pp. 3347,3353, Sep. 2005.*

Hunziker, T.; Aono, T.; Ohira, T., “An iterative beamforming technique for OFDM-based wireless networks with uncoordinated channel access,” Communications, 2004 IEEE International Conference on , vol. 5, No., pp. 2751 vol. 5,, Jun. 20-24, 2004.*

Jurgen Haring; Vinck, A. J H, “Iterative decoding of codes over complex numbers for impulsive noise channels,” Information Theory, IEEE Transactions on , vol. 49, No. 5, pp. 1251,1260, May 2003.*

* cited by examiner

*Primary Examiner* — Cynthia Britt
(74) *Attorney, Agent, or Firm* — Sherr & Jiang, PLLC

(57) ABSTRACT

A decoding device including a decoding unit which decodes encoded data, an inverse orthogonal transformation unit which performs inverse orthogonal transformation for the encoded data and obtains a time series waveform element in a unit of blocks, a correlation calculation unit which obtains a correlation between a time series waveform element of a block arranged immediately before an error block which is a block in which an error has occurred during decoding by the decoding unit and a time series waveform element of a block arranged a predetermined number of blocks before the block, a cycle calculation unit which obtains a basic cycle of a block unit of the error block based on the correlation obtained by the correlation calculation unit, and a generation unit which generates a substitute signal of the time series waveform element of the error block.

20 Claims, 9 Drawing Sheets

DECODING DEVICE, DECODING METHOD, AND PROGRAM FOR GENERATING A SUBSTITUTE SIGNAL WHEN AN ERROR HAS OCCURRED DURING DECODING

BACKGROUND

The present disclosure relates to a decoding device, a decoding method, and a program, and particularly to a decoding device, a decoding method, and a program which are designed to easily generate substitute signals having little incompatibility when an error occurs during decoding.

From the past, there has been an encoding device which overlaps audio signals of adjacent blocks, and performs orthogonal transformation and encoding for the signals. A decoding device, which decodes encoded data generated in such an encoding device, performs inverse orthogonal transformation, and outputs audio signals, generates substitute signals for the purpose of masking an error when the error occurs during the decoding.

As a method of generating the substitute signals, for example, there is a method in which a pitch cycle is obtained and substitute signals are generated from past decoding signals based on the pitch cycle (refer to, for example, Japanese Unexamined Patent Application Publication (Translation of PCT Application) Nos. 2002-542518 and 2002-542519).

In the method of generating substitute signals disclosed in Japanese Unexamined Patent Application Publication (Translation of PCT Application) Nos. 2002-542518 and 2002-542519, an automated correlation between a decoding signal immediately before an error occurs and a past decoding signal traced back from the foregoing decoding signal by a predetermined number of samples is obtained for each of the predetermined number of samples, and a predetermined number of samples when the automated correlation becomes the maximum value is obtained as a pitch cycle.

SUMMARY

In the above-described method, however, a large number of arithmetic operations are necessary to obtain the pitch cycle. Particularly, when a sampling frequency is high, the range of the number of samples corresponding to an assumed range of the pitch cycle is wide, and thus, the number of arithmetic operations for obtaining the pitch cycle becomes large. Accordingly, it was difficult to generate substitute signals having little incompatibility from past decoding signals based on the pitch cycle.

It is desirable to make generation of substitute signals having little incompatibility easy when an error occurs during decoding.

According to an embodiment of the present disclosure, there is provided a decoding device including a decoding unit which decodes encoded data obtained after audio signals of adjacent blocks are overlapped, undergo orthogonal transformation, and encoded, an inverse orthogonal transformation unit which performs inverse orthogonal transformation for the encoded data that has been decoded by the decoding unit and obtains a time series waveform element in a unit of blocks, a correlation calculation unit which obtains a correlation between a time series waveform element of a block arranged immediately before an error block which is a block in which an error has occurred during decoding by the decoding unit and a time series waveform element of a block arranged a predetermined number of blocks before the block, a cycle calculation unit which obtains a basic cycle of a block unit of the error block based on the correlation obtained by the correlation calculation unit, and a generation unit which generates a substitute signal of the time series waveform element of the error block using the time series waveform element of the block arranged forward from the error block by a basic cycle of the block unit based on the basic cycle obtained by the cycle calculation unit.

A decoding method and a program according to another embodiment of the disclosure correspond to the decoding device of the embodiment of the disclosure.

According to still another embodiment of the disclosure, encoded data is decoded, which is obtained after audio signals of adjacent blocks are overlapped, undergo orthogonal transformation, and encoded, the encoded data that has been decoded undergoes inverse orthogonal transformation to obtain a time series waveform element in a unit of blocks, a correlation between a time series waveform element of a block arranged immediately before an error block which is a block in which an error has occurred during decoding and a time series waveform element of a block arranged forward from the block by a predetermined number of blocks is obtained, a basic cycle of a block unit of the error block is obtained based on the correlation, the time series waveform element of the block arranged forward from the error block by a basic cycle of the block unit is generated based on the basic cycle as a substitute signal of the time series waveform element of the error block.

According to still another embodiment of the disclosure, the decoding device may be an individual device, or an internal block constituting one device.

According to still another embodiment, when an error occurs during decoding, it is possible to easily generate a substitute signal with little incompatibility.

DETAILED DESCRIPTION OF EMBODIMENTS

Embodiment

[Configuration Example of Embodiment of Decoding Device]

Figure 1:
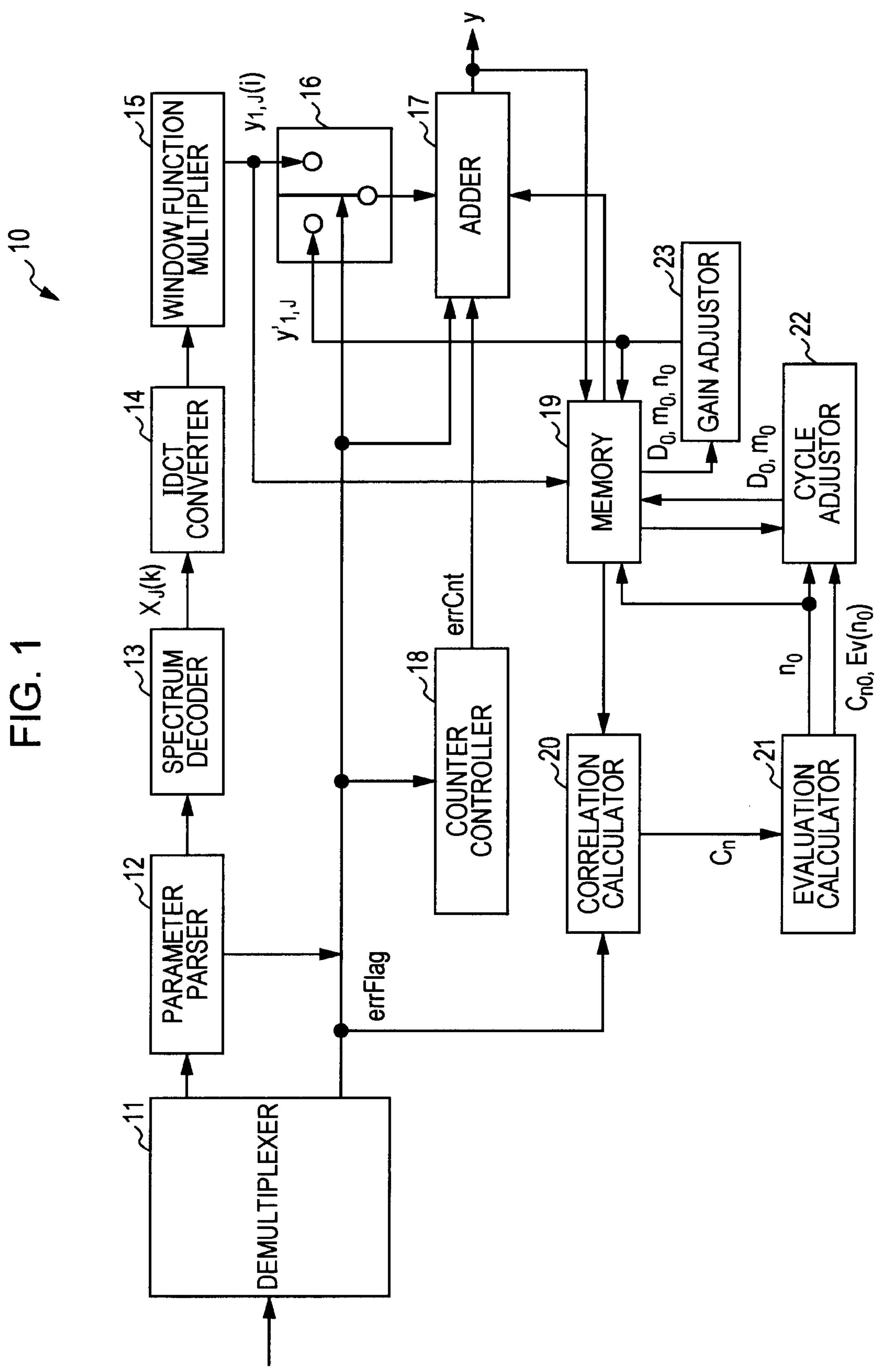
FIG. 1 is a block diagram showing a configuration example of an embodiment of a decoding device to which the disclosure is applied.

FIG. 1 is a block diagram showing a configuration example of an embodiment of a decoding device to which the disclosure is applied.

The decoding device 10 of FIG. 1 is configured by a demultiplexer 11, a parameter parser 12, a spectrum decoder 13, an IDCT (Inverse Discrete Cosine Transform) transformer 14, a window function multiplier 15, a switch 16, an adder 17, a counter controller 18, a memory 19, a correlation calculator 20, an evaluation calculator 21, a cycle adjustor 22, and a gain adjustor 23. The decoding device 10 decodes encoded data obtained as a result of the fact that audio signals that are time series signals of adjacent blocks are overlapped, and subjected to orthogonal transformation and to encoding.

Specifically, the demultiplexer 11 of the decoding device 10 receives packets of encoded data through a circuit not shown in the drawing, or the like. The demultiplexer 11 performs demultiplexing for the received packets of the encoded data and extracts the encoded data. At this moment, the demultiplexer 11 detects the occurrence of a loss or an error in the packets, and sets errFlag indicating occurrence and non-occurrence of an error during decoding to be supplied to the switch 16, the adder 17, and counter controller 18, and the correlation calculator 20 according to the detection result. In addition, when the occurrence of a loss or an error in the packets is not detected, the demultiplexer 11 supplies the extracted encoded data to the parameter parser 12.

The parameter parser 12 extracts an encoded spectrum of audio signals from the encoded data supplied from the demultiplexer 11 in a unit of blocks. At this moment, the parameter parser 12 detects the occurrence of an extraction error, and sets errFlag to be supplied to the switch 16, the adder 17, the counter controller 18, and the correlation calculator 20 according to the detection result. In addition, when the occurrence of an extraction error is not detected, the parameter parser 12 supplies the extracted encoded spectrum in a unit of blocks to the spectrum decoder 13.

The spectrum decoder 13 decodes the encoded spectrum of a unit of blocks supplied from the parameter parser 12. The spectrum decoder 13 supplies k ($0 \le k \le NB-1$) MDCT spectra $X_J(k)$ of J-th block obtained from the result to the IDCT transformer 14. Furthermore, NB is the length of a block, and the number of sample blocks, that is, the value of ½ of a transform block length NT.

The IDCT transformer 14 and the window function multiplier 15 function as inverse orthogonal transforming units, and perform a part of IMDCT (Inverse Modified Discrete Cosine Transform) for the MDCT spectra $X_J(k)$ supplied from the spectrum decoder 13. Specifically, the IDCT transformer 14 performs IDCT for the MDCT spectra $X_J(k)$ supplied from the spectrum decoder 13 and supplies time series signal obtained from the result to the window function multiplier 15.

The window function multiplier 15 multiplies the time series signals supplied from the IDCT transformer 14 by a window function in the inverse direction, and supplies the time series signal of the unit of blocks obtained from the result to the switch 16 and the memory 19 as a waveform element $y_{1,J}(i)$ ($0 \le i \le 2NB-1$) of a J-th block.

The switch 16 selects the waveform element $y_{1,J}(i)$ ($0 \le i \le 2NB-1$) supplied from the window function multiplier 15 or a substitute waveform element $y'_{1,J}$ that is a substitute signal of half of the waveform element of the J-th block supplied from the gain adjustor 23 according to the errFlag supplied from the demultiplexer 11 and supplies the result to the adder 17.

The adder 17 adds half the waveform element $y_{1,J}$ or the substitute waveform element $y'_{1,J}$ among the waveform element $y_{1,J}(i)$ ($0 \le i \le 2NB-1$) supplied from the switch 16 or half a waveform element $y_{1,J-1}$ of one previous block or a substitute waveform element $y'_{1,J-1}$ stored in the memory 19. The adder 17 attenuates the addition result based on errFlag supplied from the demultiplexer 11 and the parameter parser 12 and errCnt supplied from the counter controller 18. In other words, the adder 17 suppresses amplitude of the addition result based on the errFlag and errCnt. The adder 17 outputs and supplies time series signals y obtained from the result to cause the memory 19 to store the result.

The counter controller 18 sets errCnt according to the errFlag supplied from the demultiplexer 11 and the parameter parser 12, and supplies the errCnt to the adder 17.

The memory 19 functions as a storage unit, and stores at least the closest N (N is an integer) waveform elements $y_{1,J}(i)$ ($0 \le i \le 2NB-1$) supplied from the window function multiplier 15 and the substitute waveform element $y'_{1,J}$ of half a block supplied from the gain adjustor 23. Furthermore, the memory 19 may store the waveform elements $y_{1,J}(i)$ ($0 \le i \le 2NB-1$) or the substitute waveform element $y'_{1,J}$ of half a block without change, and may store them in a state of being compressed in a compressed format such as logarithmic compression, or the like.

In addition, the memory 19 stores a basic cycle $n_0$ such as a pitch cycle in a unit of blocks supplied from the evaluation calculator 21, and a deviation amount $D_0$ and a ratio $m_0$ for adjusting the basic cycle, which is supplied from the cycle adjustor 22. Furthermore, the memory 19 stores the time series signal y supplied from the adder 17.

The correlation calculator 20 reads from the memory 19 the former half of a waveform element in a prior block to a block in which an error occurs during decoding and the former half of a waveform element in a block arranged n ($1 \le n \le N$) blocks before the prior block based on the errFlag supplied from the demultiplexer 11 and the parameter parser 12. In addition, the correlation calculator 20 obtains a correlation value $C_n$ between the former half of the waveform element in the prior block to the block in which the error occurs during decoding and the former half of the waveform element in the block arranged n blocks before the prior block for each n, and supplies the result to the evaluation calculator 21.

The evaluation calculator 21 calculates for each n an evaluation value Ev(n) of a block arranged n blocks before a prior block to the block in which an error occurs during decoding based on the correlation value $C_n$ supplied from the correlation calculator 20. The evaluation calculator 21 determines n when the evaluation value Ev(n) becomes the maximum value among N evaluation values Ev(n) as the basic cycle $n_0$ in a unit of blocks of the block in which an error occurs during decoding, and supplies the result to the memory 19 and the cycle adjustor 22. In addition, the evaluation calculator 21 supplies the evaluation value $Ev(n_0)$ and the correlation value $C_{n0}$ to the cycle adjustor 22.

The cycle adjustor 22 corrects the basic cycle $n_0$ of a block unit to $n_0/m_0$ based on the basic cycle $n_0$ of a block unit, the evaluation value $Ev(n_0)$ and the correlation value $C_{n0}$ supplied from the evaluation calculator 21, and the waveform element of half a block stored in the memory 19. In addition, the cycle adjustor 22 obtains a deviation amount $D_0$ of the basic cycle of a block in which an error has occurred during decoding from a cycle of a block based on the basic cycle $n_0$ of a block unit, the correlation value $C_{n0}$, and the waveform element and the time series signal stored in the memory 19. The cycle adjustor 22 supplies the ratio $m_0$ of the basic cycle $n_0/m_0$ of a block unit after correction to the basic cycle $n_0$ of a block unit before correction and the deviation amount $D_0$ of the basic cycle from the cycle of a block to the memory 19.

The gain adjustor 23 reads the basic cycle $n_0$ of a block unit, the ratio $m_0$, and the deviation amount $D_0$ from the memory 19. In addition, the gain adjustor 23 functions as a generation unit, and obtains half a waveform element of a block arranged $n_0/m_0+D_0$ blocks before the block in which an error has occurred during decoding based on the basic cycle $n_0$ of a block unit, the ratio $m_0$, and the deviation amount $D_0$. The gain adjustor 23 generates the substitute waveform element $y'_{1,J}$ of half a block by amplifying the obtained waveform element of the half block and supplies the result to the memory 19 and the switch 16.

[Description of MDCT Spectrum]

Figure 2:
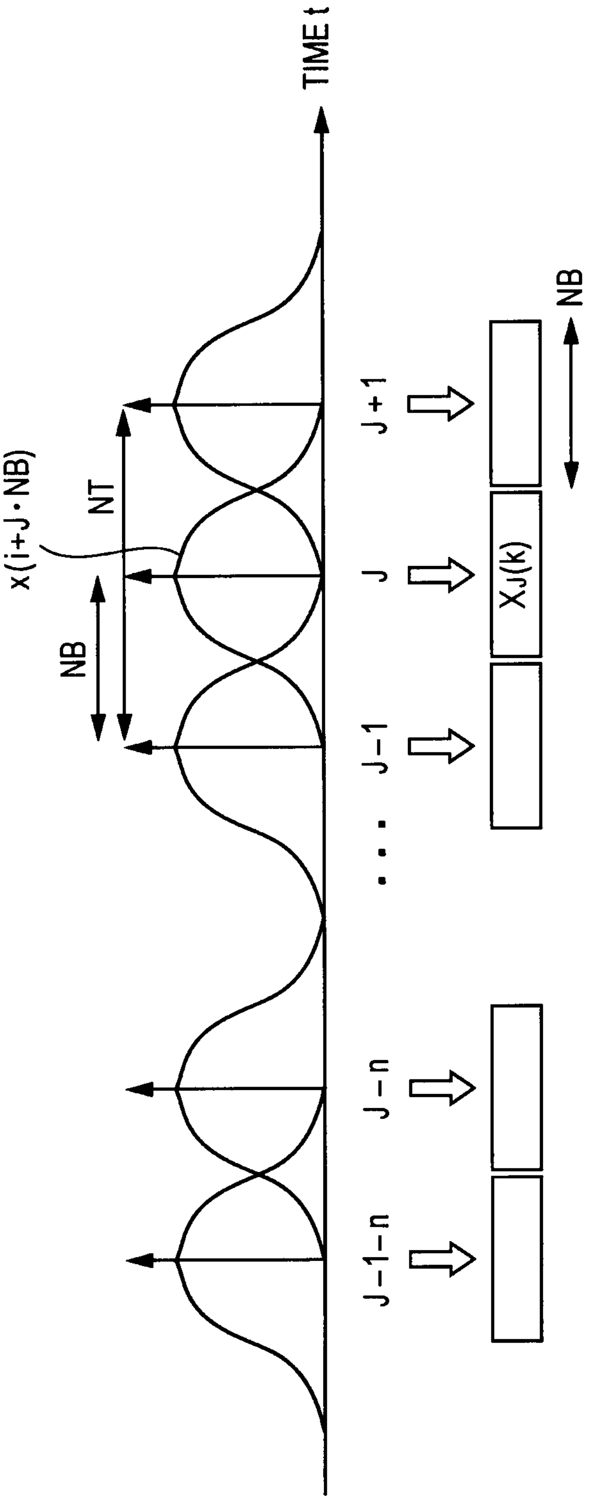
FIG. 2 is a diagram illustrating an MDCT spectrum.

FIG. 2 is a diagram illustrating the MDCT spectrum $X_J(k)$.

As shown in FIG. 2, the MDCT spectrum $X_J(k)$ is subjected to orthogonal transformation so that audio signals of adjacent blocks overlap. Specifically, in the MDCT, the former half of a time series signal x(i+J·NB) (0≤i≤NB−1) of a J-th block overlaps with the latter half of a time series signal x(i+(J−1)·NB) (NB≤i≤2NB−1) of a J−1-th block arranged one block before. In addition, the latter half of the time series signal x(i+J·NB) (NB≤i≤2NB−1) of the J-th block overlaps with the former half of a time series signal x(i+(J+1)·NB) (0≤i≤NB−1) of a J+1-th block arranged one block after. Then, using Formula (1) below, the time series signal x(i+J·NB) (0≤i≤2NB−1) of J-th block of 2NB (=NT) samples is transformed to NB MDCT spectrum $X_J(k)$.

$$X_J(k) = \frac{2}{NB}\sum_{i=0}^{2NB-1} w_1(i)a(k, i)x(i + J \cdot NB) \quad (1)$$

$$a(k, i) = \cos\left(\frac{\pi(2k+1)(2i+NB+1)}{4NB}\right)$$

$$(0 \le k \le NB-1,\ 0 \le i \le 2NB-1)$$

In Formula (1), $w_1(i)$ is a window function of a forward direction.

As above, since the MDCT spectrum $X_J(k)$ is subjected to orthogonal transformation so that the audio signals of adjacent blocks overlap, there is a little block distortion.

The IDCT transformer 14 and the window function multiplier 15 of FIG. 1 transform the NB MDCT spectra $X_J(k)$ obtained as above to a waveform element $y_{1,J}(i)$ (0≤i≤2NB−1) of 2NB (=NT) samples using Formula (2) below. Specifically, the IDCT transformer 14 performs multiplication of the MDCT spectrum $X_J(k)$ and a transform coefficient b(k,i) of Formula (2) below, and the window function multiplier 15 multiplies the multiplication result by a window function $w_2(i)$ in the inverse direction.

$$y_{1,J}(i) = w_2(i)\sum_{k=0}^{NB-1} b(k, i)X_J(k) \quad (2)$$

$$b(k, i) = \cos\left(\frac{\pi(2k+1)(2i+NB+1)}{4NB}\right)$$

$$(0 \le k \le NB-1,\ 0 \le i \le 2NB-1)$$

Then, the adder 17 of FIG. 1 adds the former half of the waveform element $y_{1,J}(i)$ (0≤i≤NB−1) of the J-th block and the latter half of the waveform element $y_{1,J-1}$(i+NB) (0≤i≤NB−1) of the J−1-th block to obtain a time series signal y(i+J·NB) (0≤i≤NB−1) using Formula (3) below.

$$y(i+J \cdot NB) = y_{1,J-1}(i+NB) + y_{1,J}(i)\ (0 \le i \le NB-1) \quad (3)$$

[Generation Method of Substitute Time Series Signal]

FIGS. 3 to 6 are diagrams illustrating a generation method of a substitute time series signal. Furthermore, in FIGS. 3 to 6, the solid line indicates a time series signal of a block in which an error does not occur during decoding, and the dotted line indicates a time series signal of a block in which an error has occurred during decoding.

Figure 3:
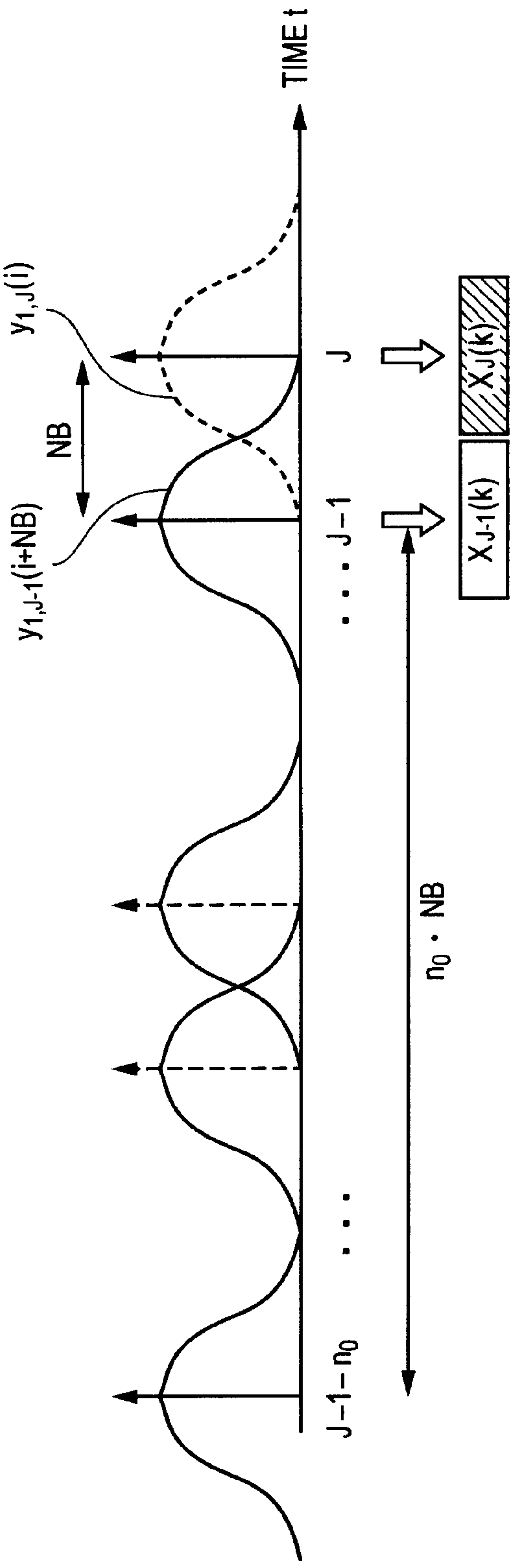
FIG. 3 is a diagram showing a time series signal when an error occurs during new decoding.

As shown in FIG. 3, when an error occurs during new decoding in J-th block, an error does not occur during decoding in J−1-th block which is arranged one block before. Thus, in the time series signal y(i+J·NB) (0≤i≤NB−1) of the J-th block, an error does not occur in the latter half of the waveform element $y_{1,J-1}$(i+NB) (0≤i≤NB−1) of the J−1-th block, but an error occurs in the former half of the waveform element $y_{1,J}(i)$ (0≤i≤NB−1) of the J-th block.

Thus, the correlation calculator 20 first obtains, for each n, a cross-correlation value R, of the latter half of the waveform element $y_{1,J-1}$(i+NB) (0≤i≤NB−1) of the J−1-th block, which is a prior block of the J-th block in which an error has occurred and the latter half of a waveform element $y_{1,J-1-n}$(i+NB) (0≤i≤NB−1) of the J−1−n-th block, which is arranged n blocks before the J−1-th block, by Formula (4) below.

$$R_n = \sum_{i=0}^{NB-1} y_{1,J-1}(i+NB) \cdot y_{1,J-1-n}(i+NB)(1 \le n \le N) \quad (4)$$

In addition, the correlation calculator 20 obtains a power value $P_n$ of the latter half of a waveform element $y_{1,J-1-n}$(i+NB) (0≤i≤NB−1) of the J−1−n-th block by Formula (5) below.

$$P_n = \sum_{i=0}^{NB-1} (y_{1,J-1-n}(i+NB))^2(1 \le n \le N) \quad (5)$$

Then, the correlation calculator 20 obtains a correlation value $C_n$ by Formula (6) below using the cross-correlation value $R_n$ and the power value $P_n$ obtained as above.

$$C_n = \frac{R_n}{\sqrt{P_0 \cdot P_n}}(1 \le n \le N) \quad (6)$$

Next, the evaluation calculator 21 obtains an evaluation value Ev(n) by Formula (7) below added with n that is a block interval, or the like using the correlation value $C_n$ obtained by the correlation calculator 20.

$$Ev(n) = a \cdot C_n + b \cdot \left(1 - \frac{n}{N}\right)(0 \le a,\ b \le 1,\ 1 \le n \le N) \quad (7)$$

Furthermore, a formula for obtaining the evaluation value Ev(n) is not limited to Formula (7).

The evaluation calculator 21 determines n when the evaluation value Ev(n) obtained as above becomes the maximum as the basic cycle $n_0$ of a block unit.

Here, the basic cycle of normal audio signals is approximately 2.5 msec to 20 msec, and it is considered that the correlation becomes high within a range of n corresponding to 2.5 msec to 20 msec in audio signals with strong cyclicality. For example, in a case of a short cycle of a block such as 1/750 seconds (1.33 msec), the basic cycle is about two to fifteen times the cycle of a block, and it is considered that the correlation becomes high when n is within the range of two to fifteen times in the audio signals with strong cyclicality. Furthermore, in this case, if the number of sampling frequency is assumed to be 48000 Hz, the block length NB is 64, and the transform block length NT is 128.

As above, since the correlation becomes high within the range of n corresponding to 2.5 msec to 20 msec in the audio signals with strong cyclicality, the decoding device 10 sets N to be, for example, equal to or higher than the maximum value of n corresponding to 20 msec.

Figure 4:
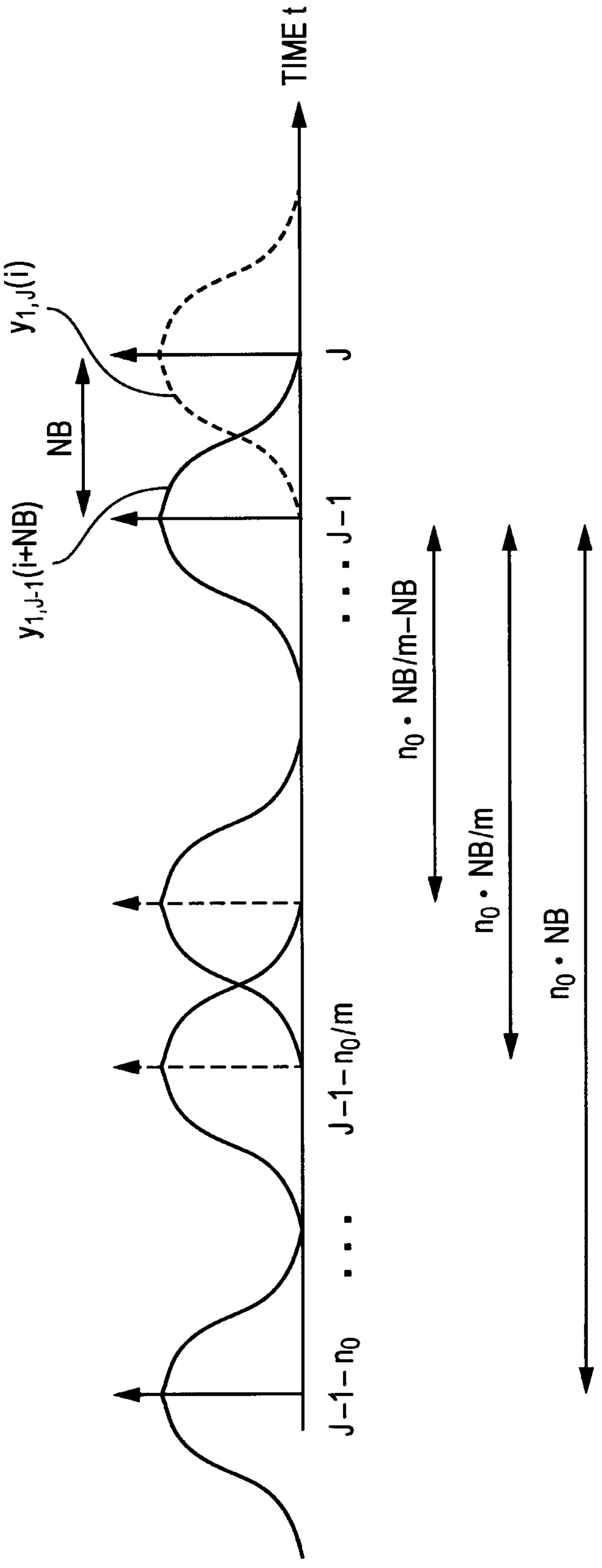
FIG. 4 is a diagram illustrating correction of a basic cycle of a block unit.

However, when the basic cycle $n_0$ of a block unit has a relatively large value, there is a possibility that the basic cycle $n_0$ of a block unit is an integral multiple of an actual basic cycle of a block unit. Thus, the cycle adjustor 22 obtains, for each m, a correlation value $C_{n0/m}$ (fractional correlation) of the latter half of the waveform element $y_{1,J-1}(i+NB)$ $(0 \leq i \leq NB-1)$ of the J−1-th block right before the J-th block in which an error has occurred and the latter half of a waveform element $y_{1,J-1-n0/m}(i+NB)$ $(0 \leq i \leq NB-1)$ of the J−1−$n_0$/m-th block using the above-described Formulas (4) to (6) as shown in FIG. 4. Furthermore, m is an integer equal to or higher than 2 and equal to or lower than the basic cycle $n_0$ of a unit of blocks, and a waveform element $y_{1,J-1-n0/m}(i+NB)$ $(0 \leq i \leq NB-1)$ is obtained by Formula (8) below.

$$z(i) = w_1(i+NB) \cdot y\left(J \cdot NB - \frac{n_0 \cdot NB}{m} + i\right) + w_1(2 \cdot NB - 1 - i) \cdot y\left((J+1) \cdot NB - \frac{n_0 \cdot NB}{m} - i - 1\right) \quad (0 \leq i \leq NB/2-1) \tag{8}$$

$$y_{1,J-1-n0/m}(i+NB) = w_2(i+NB) \cdot z(NB/2-1-i)(0 \leq i \leq NB/2-1)$$

$$y_{1,J-1-n0/m}(i+3 \cdot NB/2) = w_2(i+3 \cdot NB/2) \cdot z(i)(0 \leq i \leq NB/2-1)$$

Then, the cycle adjustor 22 corrects the basic cycle $n_0$ of a block unit to $n_0/m_0$ by setting the ratio $m_0$ to m when a correlation value $C_{n0/m}$ has the maximum value when the correlation value $C_{n0/m}$ is higher than the correlation value $C_{n0}$. On the other hand, when the correlation value $C_{n0/m}$ is not higher than the correlation value $C_{n0}$, the cycle adjustor 22 sets the ratio $m_0$ to 1 and does not correct the basic cycle of a block unit.

Figure 5:
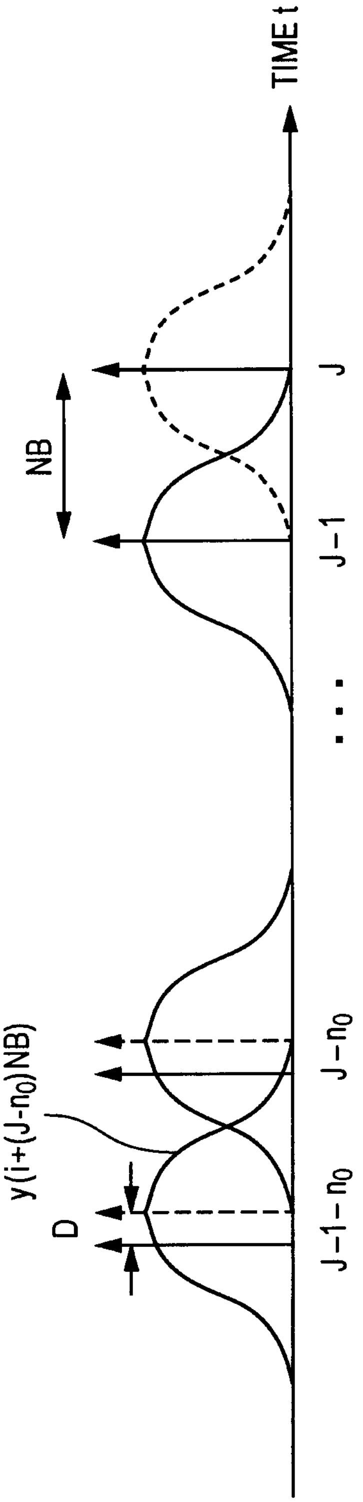
FIG. 5 is a diagram illustrating correction of the basic cycle.

In addition, when the evaluation value $Ev(n_0)$ of the basic cycle $n_0$ of a block unit has a relatively small value, it is considered that the cyclicality of the audio signals is low, or there is deviation between the basic cycle and a cycle of a block. Thus, as shown in FIG. 5, the cycle adjustor 22 obtains the latter half of a waveform element $y''_{1,J-1-n0}(i+NB)$ $(0 \leq i \leq NB-1)$ of a J−1−$n_0$-th block from a time series signal $y(i+(J-n_0)NB-D)$ $(0 \leq i \leq NB-1)$ of a block deviated forward from the J−1−$n_0$-th block by D sample, for each D, by Formula (9) below.

$$z(i)=w_1(i+NB) \cdot y(i+(J-n_0) \cdot NB-D)+w_1(2 \cdot NB-1-i) \cdot y((J-n_0+1) \cdot NB-i-1-D) \; (0 \leq i \leq NB/2-1) \; y''_{1,J-1-n_0}(i+NB)=w_2(i+NB) \cdot z(NB/2-1-i) \; (0 \leq i \leq NB/2-1) \; y''_{1,J-1-n_0}(i+3 \cdot NB/2)=w_2(i+3 \cdot NB/2) \cdot z(i) \; (0 \leq i \leq NB/2-1) \tag{9}$$

Then, the cycle adjustor 22 obtains, for each D, a correlation value $C_{n0,D}$ (deviation correlation) of the waveform element $y''_{1,J-1-n0}(i+NB)$ $(0 \leq i \leq NB-1)$ of the latter half obtained for each D by Formula (9) and the latter half of the waveform element $y_{1,J-1}(i+NB)$ $(0 \leq i \leq NB-1)$ of the J−1-th block using the same formula as the above-described Formulas (4) to (6).

The cycle adjustor 22 obtains D when the correlation value $C_{n0,D}$ has the maximum value as a deviation amount $D_0$ when the correlation value $C_{n0,D}$ is higher than the correlation value $C_{n0}$. On the other hand, when the correlation value $C_{n0,D}$ is not higher than the correlation value $C_{n0}$, the cycle adjustor 22 sets the deviation amount $D_0$ to 0.

As above, if the basic cycle $n_0$ of a block unit, the ratio $m_0$, and the deviation amount $D_0$ are decided, the gain adjustor 23 generates the substitute waveform element $y'_{1,J}(i)$ $(0 \leq i \leq NB-1)$ of the latter half of the waveform element $y_{1,J}(i)$ $(0 \leq i \leq NB-1)$ of the J-th block in which an error has occurred during decoding by Formula (10) below.

$$y_{1,J'}(i) = g \cdot y_{1,J-n0/m0}(i)(0 \leq i \leq NB-1)(\text{when } D=0) \tag{10}$$

$$y_{1,J'}(i) = g \cdot y''_{1,J-n0/m0}(i)(0 \leq i \leq NB-1)(\text{when } D \neq 0)$$

$$g = \frac{R_{n0}}{P_{n0}}$$

Then, the adder 17 obtains a substitute time series signal $y'(i+J \cdot NB)$ $(0 \leq i \leq NB-1)$ of a time series signal $y(i+J \cdot NB)$ $(0 \leq i \leq NB-1)$ by Formula (11) below. The substitute time series signal $y'(i+J \cdot NB)$ $(0 \leq i \leq NB-1)$ is output as the time series signal $y(i+J \cdot NB)$ $(0 \leq i \leq NB-1)$.

$$y'(i+J \cdot NB)=\alpha(i) \cdot (y_{1,J-1}(i+NB)+y_{1,J}'(i)) \; (0 \leq i \leq NB-1) \tag{11}$$

Furthermore, in Formula (11), $\alpha(i)$ is 1 when an error has newly occurred during decoding and is an attenuation coefficient which approaches 0 as the length of a period in which an error keeps occurring thereafter becomes longer.

Next, a case will be described, in which an error occurs in J+1-th block next to the J-th block during decoding.

In this case, the gain adjustor 23 generates a substitute waveform element $y'_{1,J+1}(i)$ $(0 \leq i \leq NB-1)$ of a waveform element $y_{1,J+1}(i)$ $(0 \leq i \leq NB-1)$ from the waveform element $y_{1,J+1-n0/m0}(i)$ $(0 \leq i \leq NB-1)$ of a J−$n_0$/$m_0$+1-th block next to the block of the waveform element used for generating the substitute waveform element $y'_{1,J}(i)$ $(0 \leq i \leq NB-1)$ or a waveform element $y''_{1,J+1-n0/m0}(i)$ $(0 \leq i \leq NB-1)$ with Formula (10) described above, based on the basic cycle $n_0$ of a block unit of the J-th block, the ratio $m_0$, and the deviation amount $D_0$.

In addition, the gain adjustor 23 generates a substitute waveform element $y'_{1,J}(i+NB)$ $(0 \leq i \leq NB-1)$ of a waveform element $y_{1,J}(i+NB)$ $(0 \leq i \leq NB-1)$ from the waveform element $y_{1,J-n0/m0}(i+NB)$ $(0 \leq i \leq NB-1)$ of a J−$n_0$/$m_0$-th block by the same formula as the above-described Formula (10).

Then, the adder 17 adds the substitute waveform element $y'_{1,J}(i+NB)$ $(0 \leq i \leq NB-1)$ to the substitute waveform element $y'_{1,J+1}(i)$ $(0 \leq i \leq NB-1)$ by the same formula as Formula (11) described above, and causes the result to attenuate to the attenuation coefficient $\alpha(i)$ approaching 0 further than in the time of generating the substitute time series signal $y'(i+J \cdot NB)$ $(0 \leq i \leq NB-1)$. A substitute time series signal $y'(i+(J+1) \cdot NB)$ $(0 \leq i \leq NB-1)$ obtained from the result is output as a time series signal $y(i+(J+1) \cdot NB)$ $(0 \leq i \leq NB-1)$.

In the same manner as above, thereafter, as long as errors keep occurring, a waveform element used in generation of a substitute waveform element is decided based on the basic cycle $n_0$ of a block unit of the J-th block, the ratio $m_0$, and the deviation amount $D_0$. Then, the generated substitute waveform elements in the former and latter halves of adjacent blocks are added, and the result is more attenuated than in the previous addition.

Figure 6:
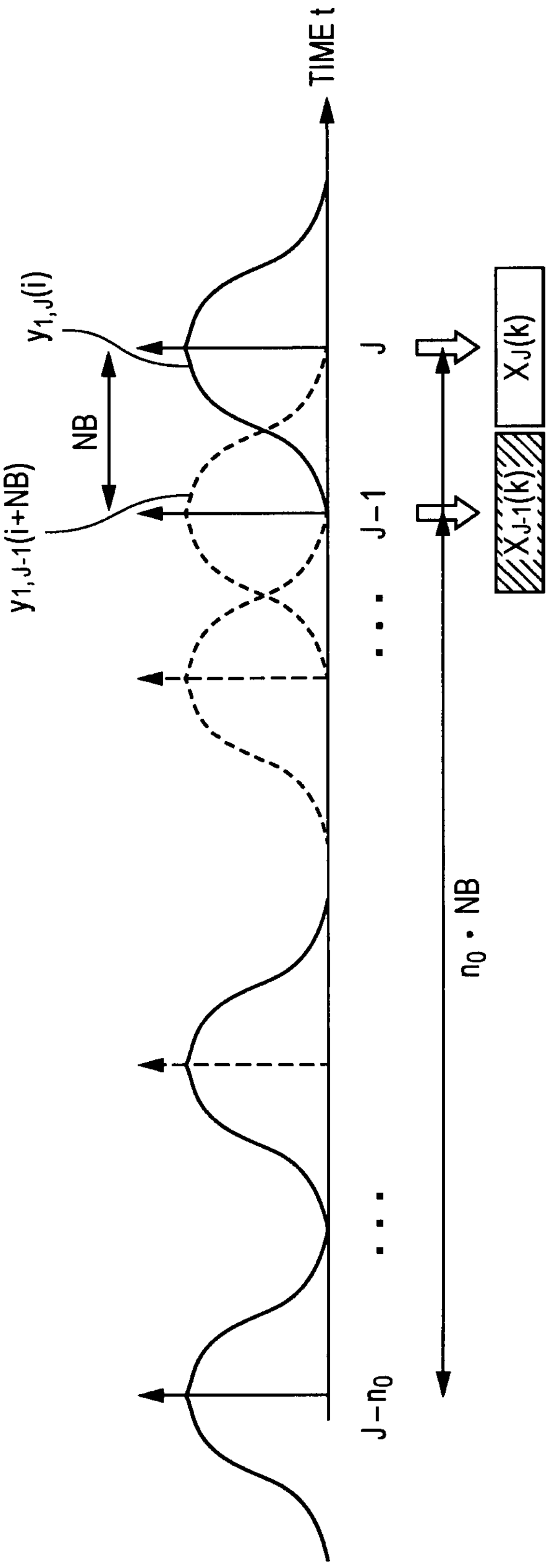
FIG. 6 is a diagram showing the time series signal when an error does not occur.

Next, as shown in FIG. 6, a case will be described, in which an error does not occur in the J-th block.

In this case, an error occurs in the J−1-th block arranged one block before. Accordingly, in the time series signal $y(i+J \cdot NB)$ $(0 \leq i \leq NB-1)$ of the J-th block, an error has not occurred in the former half of the waveform element $y_{1,J}(i)$ $(0 \leq i \leq NB-1)$ of the J-th block, but an error has occurred in the latter half of the waveform element $y_{1,J-1}(i+NB)$ $(0 \leq i \leq NB-1)$ of the J−1-th block.

Hence, the gain adjustor 23 generates the substitute waveform element $y'_{1,J-1}(i+NB)$ $(0 \le i \le NB-1)$ of the waveform element $y_{1,J-1}(i+NB)$ $(0 \le i \le NB-1)$ from a waveform element $y_{1,J-2-n0/m0}(i+NB)$ $(0 \le i \le NB-1)$ used in the generation of a substitute waveform element $y'_{1,J-2}(i+NB)$ $(0 \le i \le NB-1)$, the latter half of a waveform element $y_{1,J-1-n0/m0}(i+NB)$ $(0 \le i \le NB-1)$ of a block next to the block of the waveform element $y''_{1,J-1-n0/m0}(i+NB)$ $(0 \le i \le NB-1)$, or the waveform element $y''_{1,J-1-n0/m0}(i+NB)$ $(0 \le i \le NB-1)$ by the above-described Formula (10) based on the basic cycle $n_0$ of a block unit of a block in which an error starts occurring, the ratio $m_0$, and the deviation amount $D_0$.

Then, the adder 17 obtains the substitute time series signal $y'(i+J \cdot NB)$ $(0 \le i \le NB-1)$ of the time series signal $y(i+J \cdot NB)$ $(0 \le i \le NB-1)$ by Formula (12) below. The substitute time series signal $y'(i+J \cdot NB)$ $(0 \le i \le NB-1)$ is output as the time series signal $y(i+J \cdot NB)$ $(0 \le i \le NB-1)$.

$$y'(i+J \cdot NB)=\beta(i)\cdot(y'_{1,J-1}(i+NB)+y_{1,J}(i))\ (0 \le i \le NB-1) \quad (12)$$

Furthermore, in Formula (12), $\beta(i)$ is an attenuation coefficient which approaches 1 from the prior attenuation coefficient $\alpha(i)$.

[Description of Process of Decoding Device]

Figure 7:
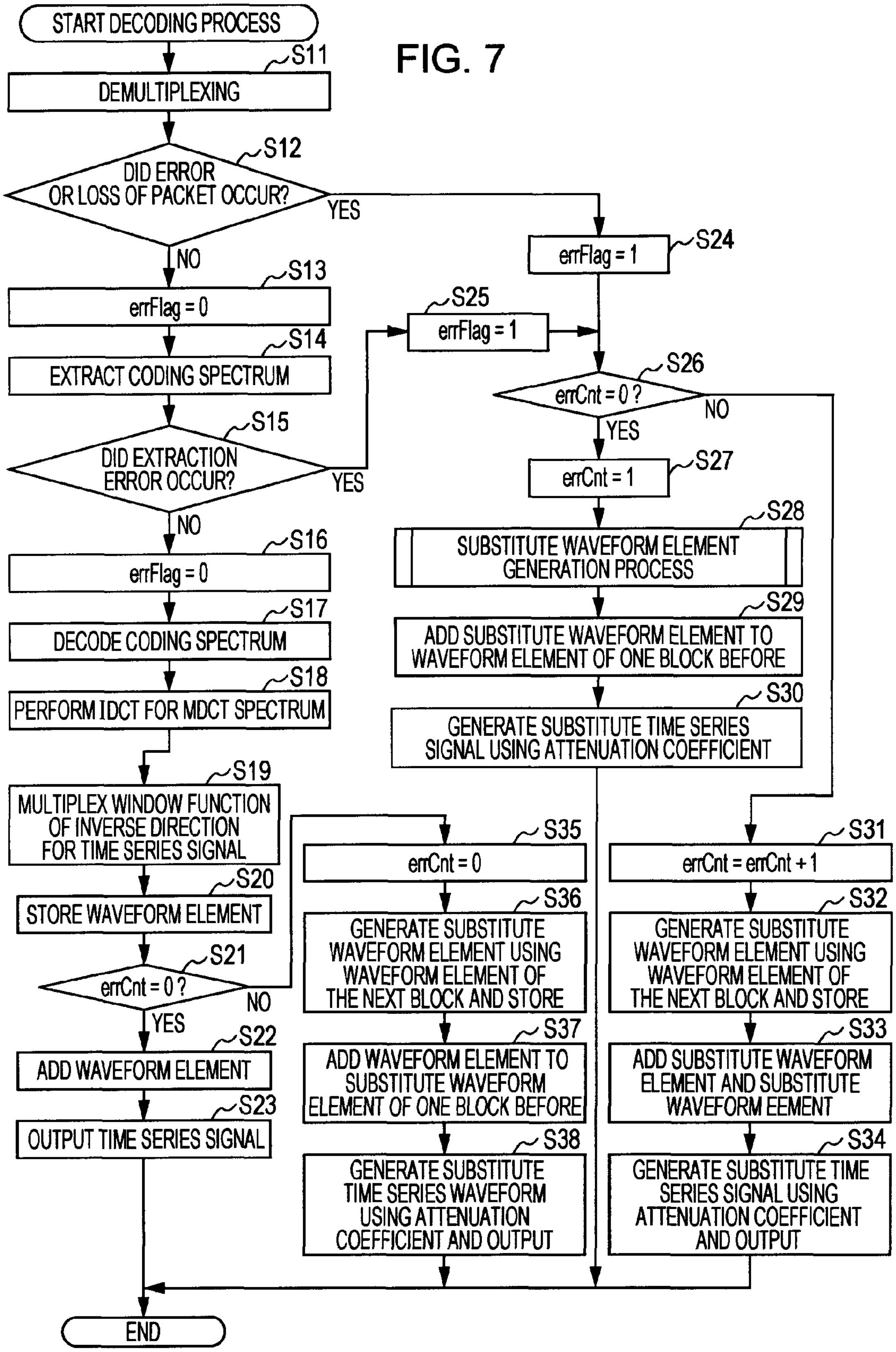
FIG. 7 is a flowchart illustrating a decoding process of the decoding device of FIG. 1.

FIG. 7 is a flowchart illustrating a decoding process of the decoding device 10 of FIG. 1. The decoding process starts when, for example, a packet of encoded data is input to the decoding device 10. Furthermore, the initial value of errCnt is 0.

In Step S11 of FIG. 7, the demultiplexer 11 performs demultiplexing for the input packet of the encoded data and extracts the encoded data.

In Step S12, the demultiplexer 11 determines whether or not an error or a loss occurs in the packet. When it is determined that an error or a loss has not occurred in the packet in Step S12, the demultiplexer 11 sets errFlag to be supplied to the switch 16, the adder 17, the counter controller 18, and the correlation calculator 20 to 0 in Step S13. In addition, the demultiplexer 11 supplies the encoded data extracted in Step S11 to the parameter parser 12.

In Step S14, the parameter parser 12 extracts an encoded spectrum of audio signals from the encoded data supplied from the demultiplexer 11.

In Step S15, the parameter parser 12 determines whether or not an extraction error has occurred. When it is determined that an extraction error has not occurred in Step S15, the parameter parser 12 sets errFlag to be supplied to the switch 16, the adder 17, the counter controller 18, and the correlation calculator 20 to 0 in Step S16. In addition, the parameter parser 12 supplies the extracted encoded spectrum to the spectrum decoder 13.

In Step S17, the spectrum decoder 13 decodes the encoded spectrum supplied from the parameter parser 12. The spectrum decoder 13 supplies MDCT spectra $X_J(k)$ $(0 \le k \le NB-1)$ obtained from the result to the IDCT transformer 14.

In Step S18, the IDCT transformer 14 performs IDCT for the MDCT spectra $X_J(k)$ supplied from the spectrum decoder 13, and supplies the time series signal obtained from the result to the window function multiplier 15.

In Step S19, the window function multiplier 15 multiplies the time series signal supplied from the IDCT transformer 14 by a window function in the inverse direction.

In Step S20, the window function multiplier 15 supplies the time series signal of a block unit obtained from the result of the process in Step S19 to the memory 19 as the waveform element $y_{1,J}(i)$ $(0 \le i \le 2NB-1)$ and stores the signal. The waveform element $y_{1,J}(i)$ $(0 \le i \le 2NB-1)$ is also supplied to the switch 16, and the switch 16 selects the waveform element $y_{1,J}(i)$ $(0 \le i \le 2NB-1)$ and supplies the element to the adder 17.

In Step S21, the counter controller 18 determines whether or not errCnt is 0. When it is determined that the errCnt is 0 in Step S21, the process advances to Step S22.

In Step S22, the adder 17 adds the former half of the waveform element $y_{1,J}(i)$ $(0 \le i \le NB-1)$ in the waveform element $y_{1,J}(i)$ $(0 \le i \le NB-1)$ supplied from the switch 16 to the latter half of the waveform element $y_{1,J-1}(i+NB)$ $(0 \le i \le NB-1)$ which is arranged one block before stored in the memory 19 as shown in Formula (3) described above.

In Step S23, the adder 17 outputs the time series signal $y(i+J \cdot NB)$ $(0 \le i \le NB-1)$ obtained from the result of the process in Step S22, and supplies the signal to the memory 19 so as to be stored thereon to end the process.

On the other hand, when it is determined that an error or a loss in the packet has occurred in Step S12, the demultiplexer 11 sets errFlag to be supplied to the switch 16, the adder 17, the counter controller 18, and the correlation calculator 20 to 1 in Step S24. Then, the process advances to Step S26.

In addition, when it is determined that an extraction error has occurred in Step S15, the parameter parser 12 sets errFlag to be supplied to the switch 16, the adder 17, the counter controller 18, and the correlation calculator 20 to 0 and the process advances to Step S26.

In Step S26, the counter controller 18 determines whether or not errCnt is 0. When it is determined that the errCnt is 0 in Step S26, in other words, when occurrence of a new error is detected, the counter controller 18 sets the errCnt to 1 in Step S27.

In Step S28, the decoding device 10 performs a substitute waveform element generation process for generating a substitute waveform element $y'_{1,J}(i)$ $(0 \le i \le NB-1)$. Details of the substitute waveform element generation process will be described with reference to FIG. 8 later.

In Step S29, the adder 17 adds the substitute waveform element $y'_{1,J}(i)$ $(0 \le i \le NB-1)$ supplied from the switch 16 as the result of the process in Step S28 to the waveform element $y_{1,J-1}(i+NB)$ $(0 \le i \le NB-1)$ of one block before stored in the memory 19.

In Step S30, the adder 17 generates a substitute time series signal $y'(i+J \cdot NB)$ $(0 \le i \le NB-1)$ using the addition value obtained by the process in Step S29 and the attenuation coefficient $\alpha(i)$ as shown in Formula (11) described above. The adder 17 outputs the substitute time series signal $y'(i+J \cdot NB)$ $(0 \le i \le NB-1)$ as a time series signal $y(i+J \cdot NB)$ $(0 \le i \le NB-1)$ to supply to the memory 19 to store the signal, and the process ends.

On the other hand, when it is determined that the errCnt is not 0 in Step S26, in other words, when occurrence of errors is continuously detected, the counter controller 18 increases the errCnt by one in Step S31.

In Step S32, the gain adjustor 23 generates a substitute waveform element $y'_{1,J}(i)$ $(0 \le i \le NB-1)$ with the same formula as Formula (10) described above, using the waveform element of the next block to the block of the waveform element $y''_{1,J-1-n0/m0}(i)$ $(0 \le i \le NB-1)$ or the waveform element $y_{1,J-1-n0/m0}(i)$ $(0 \le i \le NB-1)$ used in the generation of the substitute waveform element $y'_{1,J-1}(i)$ $(0 \le i \le NB-1)$ of the previous time, and causes the memory 19 to store the result. In addition, the gain adjustor 23 generates a substitute waveform element $y'_{1,J-1}(i)$ $(0 \le i \le NB-1)$ with the same formula as Formula (10) described above, using the latter half of the waveform element of the block of the waveform element $y''_{1,J-1-n0/m0}(i)$ $(0 \le i \le NB-1)$ or the waveform element $(0 \le i \le NB-1)$, and causes the memory 19 to store the result.

In Step S33, the adder 17 adds the substitute waveform element $y'_{1,J-1}(i+NB)$ $(0 \le i \le NB-1)$ stored in the memory 19 and the substitute waveform element $y'_{1,J}(i)$ $(0 \le i \le NB-1)$.

In Step S34, the adder 17 generates a substitute time series signal $y'(i+J\cdot NB)$ $(0 \le i \le NB-1)$ using the attenuation coefficient $\alpha(i)$ approaching 0 from the generation of the substitute time series signal $y'(i+(J-1)\cdot NB)$ $(0 \le i \le NB-1)$ in the same formula as Formula (11) described above. Then, the adder 17 outputs the substitute time series signal $y'(i+J\cdot NB)$ $(0 \le i \le NB-1)$ as a time series signal $y(i+J\cdot NB)$ $(0 \le i \le NB-1)$, and supplies the signal to the memory 19 to cause the memory 19 to store the signal, and the process ends.

In addition, when it is determined that the errCnt is not 0 in Step S21, in other words, when the occurrence of an error is not detected, the process advances to Step S35. In Step S35, the counter controller 18 sets the errCnt to 0.

In Step S36, the gain adjustor 23 generates a substitute waveform element $y'_{1,J-1}(i+NB)$ $(0 \le i \le NB-1)$ using the latter half of the waveform element of a block next to the block of the waveform element $y_{1,J-2-n0/m0}(i+NB)$ $(0 \le i \le NB-1)$ or the waveform element $y_{1,J-2-n0/m0}(i+NB)$ $(0 \le i \le NB-1)$ used in the generation of the substitute waveform element $y_{1,J-2}(i+NB)$ $(0 \le i \le NB-1)$, and causes the memory 19 to store the result.

In Step S37, the adder 17 adds the substitute waveform element $y'_{1,J-1}(i+NB)$ $(0 \le i \le NB-1)$ of one block before stored in the memory 19 to the former half of the waveform element $y_{1,J}(i)$ $(0 \le i \le NB-1)$ in the waveform element $y_{1,J}(i)$ $(0 \le i \le 2NB-1)$ supplied through the switch 16.

In Step S38, the adder 17 generates a substitute time series signal $y'(i+J\cdot NB)$ $(0 \le i \le NB-1)$ using the addition value obtained from the process in Step S37 and the attenuation coefficient $\beta(i)$ as in Formula (12) described above. Then, the adder 17 outputs the substitute time series signal $y'(i+J\cdot NB)$ as a time series signal $y(i+J\cdot NB)$ $(0 \le i \le NB-1)$, and supplies the signal to the memory 19 to cause the memory 19 to store the signal. Then, the process ends.

Furthermore, the processes in Steps S14 to S23 and Steps S25 to S38 of FIG. 7 are performed in a unit of blocks.

Figure 8:
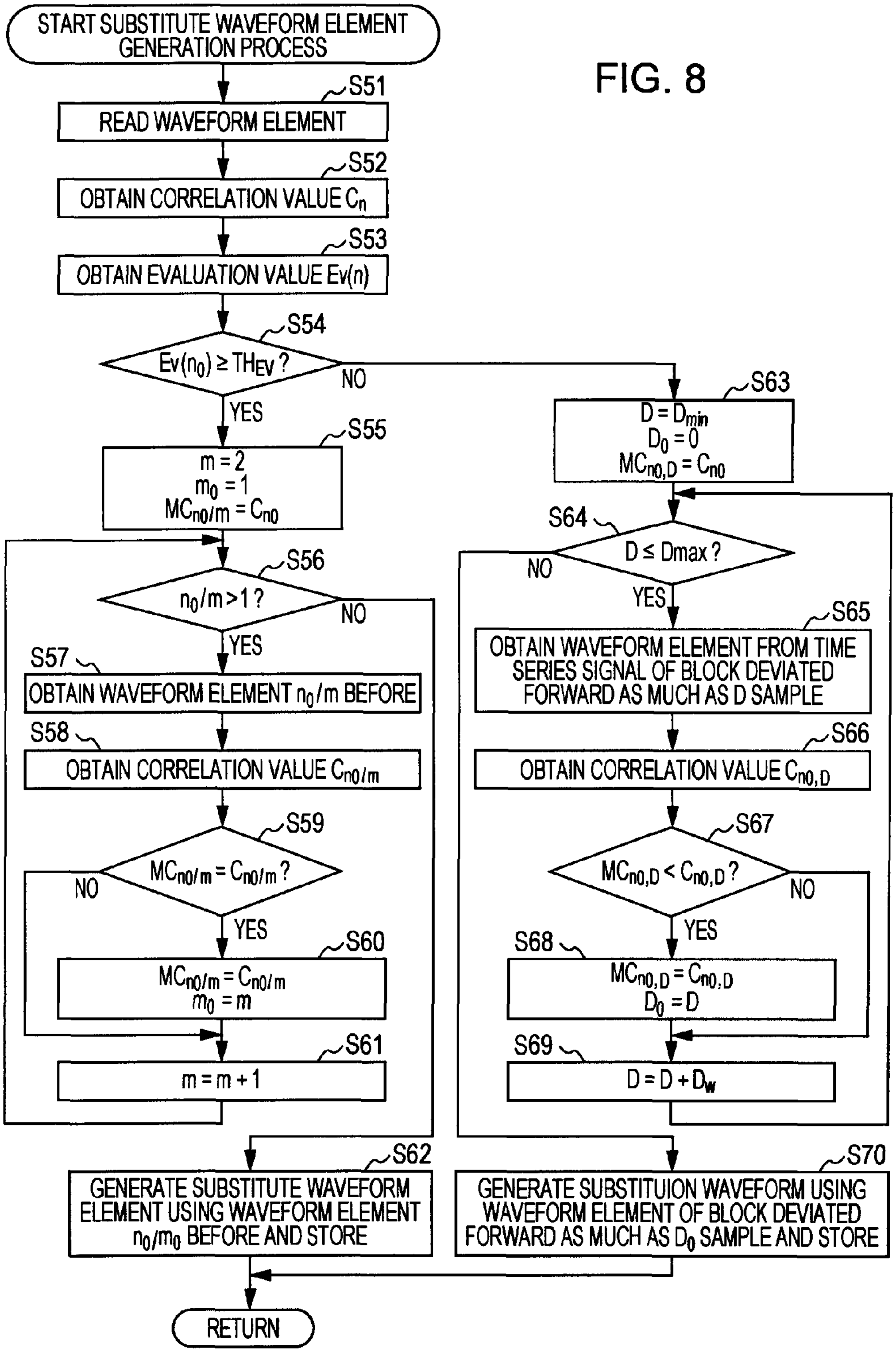
FIG. 8 is a flowchart illustrating a substitute waveform element generation process of FIG. 7 in detail.

FIG. 8 is a flowchart illustrating the substitute waveform element generation process of Step S28 of FIG. 7 in detail.

In Step S51 of FIG. 8, the correlation calculator 20 reads, from the memory 19, the latter half of the waveform element $y_{1,J-1}(i+NB)$ $(0 \le i \le NB-1)$ of a block prior to the block in which an error occurs and the latter half of the waveform element $y_{1,J-1-n}(i+NB)$ $(1 \le n \le N)$ $(0 \le i \le NB-1)$ of a block arranged n blocks before the above block.

In Step S52, the correlation calculator 20 obtains a correlation value $C_n$ using the read waveform element $y_{1,J-1}(i+NB)$ $(0 \le i \le NB-1)$ and waveform element $y_{1,J-1-n}(i+NB)$ $(0 \le i \le NB-1)$ by the above-described Formulas (4) to (6), and supplies the result to the evaluation calculator 21.

In Step S53, the evaluation calculator 21 obtains an evaluation value Ev(n) using the correlation value $C_n$ supplied from the correlation calculator 20 by Formula (7) described above. Then, the evaluation calculator 21 decides n when the evaluation value Ev(n) is at the maximum for the basic cycle $n_0$ of a block unit, and supplies the result to the memory 19 and the cycle adjustor 22. In addition, the evaluation calculator 21 supplies evaluation value $Ev(n_0)$ and correlation value $C_{n0}$ to the cycle adjustor 22.

In Step S54, the cycle adjustor 22 determines whether or not the evaluation value $Ev(n_0)$ supplied from the evaluation calculator 21 is equal to or greater than a threshold value $TH_{EV}$. When it is determined that the evaluation value $Ev(n_0)$ is equal to or greater than a threshold value $TH_{EV}$ in Step S54, the process advances to Step S55.

In Step S55, the cycle adjustor 22 sets a candidate m of a ratio $m_0$ to 2, sets the ratio $m_0$ to 1, and sets a maximum value $MC_{n0/m}$ of a correlation value $C_{n0/m}$ to the correlation value $C_{n0}$ supplied from the evaluation calculator 21.

In Step S56, the cycle adjustor 22 determines whether or not $n_0/m$ is greater than 1, in other words, $n_0$ is greater than m. When it is determined that $n_0/m$ is greater than 1 in Step S56, the process advances to Step S57.

In Step S57, the cycle adjustor 22 obtains the latter half of the waveform element $y_{1,J-1-n0/m}(i+NB)$ $(0 \le i \le NB-1)$ of a block arranged $n_0/m$ blocks before the block of the waveform element $y_{1,J-1}(i+NB)$ $(0 \le i \le NB-1)$ by Formula (8) described above using a time series signal $y((i+J\cdot NB-n_0\cdot NB/m)$ $(0 \le i \le NB-1)$ read from the memory 19. In addition, the cycle adjustor 22 reads the waveform element $y_{1,J-1}(i+NB)$ $(0 \le i \le NB-1)$ from the memory 19.

In Step S58, the cycle adjustor 22 obtains a correlation value $C_{n0/m}$ using the waveform element $y_{1,J-1}(i+NB)$ $(0 \le i \le NB-1)$ and waveform element $y_{1,J-1-n0/m}(i+NB)$ $(0 \le i \le NB-1)$ by Formulas (4) to (6) described above.

In Step S59, the cycle adjustor 22 determines whether or not the correlation value $C_{n0/m}$ of the candidate m obtained in Step S58 is greater than the maximum value $MC_{n0/m}$. When it is determined that the correlation value $C_{n0/m}$ of the candidate m is greater than the maximum value $MC_{n0/m}$ in Step S59, the process advances to Step S60.

In Step S60, the cycle adjustor 22 sets the maximum value $MC_{n0/m}$ to the correlation value $C_{n0/m}$ of the candidate m, and the ratio $m_0$ to the candidate m. Then, the process advances to Step S61.

On the other hand, when it is determined that the correlation value $C_{n0/m}$ of the candidate m is not greater than the maximum value $MC_{n0/m}$ in Step S59, the maximum value $MC_{n0/m}$ does not change, and the process advances to Step S61.

In Step S61, the cycle adjustor 22 increases the candidate m by one, and the process returns to Step S56. Then, processes of Steps S56 to S61 are performed until $n_0/m$ becomes equal to or less than 1.

When it is determined that $n_0/m$ is not greater than 1 in Step S56, the cycle adjustor 22 sets the deviation amount $D_0$ to 0, supplies the deviation amount $D_0$ and the ratio $m_0$ to the memory 19, and causes the memory to store the values. Then, in Step S62, the gain adjustor 23 obtains the former half of a waveform element $y_{1,J-n0/m0}(i)$ $(0 \le i \le NB-1)$ of a block arranged $n_0/m_0$ blocks before using Formula (13) below, generates a substitute waveform element $y'_{1,J}(i)$ $(0 \le i \le NB-1)$ by Formula (10) described above, and causes the memory 19 to store the result. Then, the process returns to Step S28 of FIG. 7, and then the process advances to Step S29.

$$y_{1,J-n0/m0}(i) = y\left(J\cdot NB - \frac{n_0\cdot NB}{m_0} + i\right) - y_{1,J-1-n0/m0}(i+NB) \quad (13)$$

$$(0 \le i \le NB-1)$$

On the other hand, when it is determined that the evaluation value $Ev(n_0)$ is not equal to or greater than a threshold value $TH_{EV}$ in Step S54, the process advances to Step S63. In Step S63, the cycle adjustor 22 sets a candidate D of the deviation amount $D_0$ to a minimum value $D_{min}$ decided in advance, sets the deviation amount $D_0$ to 0, and sets a maximum value $MC_{n0,D}$ of a correlation value $C_{n0,D}$ to the correlation value $C_{n0}$ supplied from the evaluation calculator 21.

In Step S64, the cycle adjustor 22 determines whether or not the candidate D is equal to or less than a maximum value $D_{max}$ decided in advance. When it is determined that the candidate D is equal to or less than the maximum value $D_{max}$ in Step S64, the process advances to Step S65.

In Step S65, the cycle adjustor 22 obtains a waveform element $y''_{1,J-1-n0}(i+NB)$ ($0 \le i \le NB-1$) from a time series signal $y(i+(J-n_0)NB-D)$ ($0 \le i \le NB-1$) of a block which is stored in the memory 19 and deviated forward from a $J-1-n_0$-th block by the candidate D sample by Formula (9) described above.

In Step S66, the cycle adjustor 22 obtains the correlation value $C_{n0,D}$ of the waveform element $y''_{1,J-1-n0}(i+NB)$ ($0 \le i \le NB-1$) and the waveform element $y_{1,J-1}(i+NB)$ ($0 \le i \le NB-1$) stored in the memory 19 by the same formulas as Formulas (4) to (6) described above.

In Step S67, the cycle adjustor 22 determines whether or not the correlation value $C_{n0,D}$ of the candidate D obtained in Step S66 is greater than the maximum value $MC_{n0,D}$. When it is determined that the correlation value $C_{n0,D}$ of the candidate D is greater than the maximum value $MC_{n0,D}$ in Step S67, the process advances to Step S68.

In Step S68, the cycle adjustor 22 sets the maximum value $MC_{n0,D}$ to the correlation value $C_{n0,D}$ of the candidate D, and sets the deviation amount $D_0$ to the candidate D. Then, the process advances to Step S69.

On the other hand, when it is determined that the correlation value $C_{n0,D}$ of the candidate D is not greater than the maximum value $MC_{n0,D}$ in Step S67, the maximum value $MC_{n0,D}$ does not change, and the process advances to Step S69.

In Step S69, the cycle adjustor 22 increases the candidate D by a predetermined value $D_w$ decided in advance, and the process returns to Step S64. Then, processes of Steps S64 to S69 are performed until the candidate D becomes greater than the maximum value $D_{max}$.

When it is determined that the candidate D is greater than the maximum value $D_{max}$ in Step S64, the cycle adjustor 22 sets the ratio $m_0$ to 1, supplies the ratio $m_0$ and the deviation amount $D_0$ to the memory 19 to cause the memory 19 to store the values.

Then, in Step S70, the gain adjustor 23 generates a substitute waveform element $y'_{1,J}(i)$ ($0 \le i \le NB-1$) by Formula (10) described above using the waveform element $y''_{1,J-n0}(i)$ ($0 \le i \le NB-1$) of a block deviated forward from a $J-n_0$-th block by a deviation amount $D_0$ sample, and causes the memory 19 to store the result. Furthermore, the gain adjustor 23 obtains a waveform element $y''_{1,J-n0}(i+NB)$ ($0 \le i \le NB-1$) from a time series signal $y(i+(J+1-n_0)NB-D)$ ($0 \le i \le NB-1$) of a block deviated forward from the $J-n_0$-th block by the deviation amount $D_0$ sample, stored in the memory 19, with the same formula as the above-described Formula (9).

After the process of Step S70, the process returns to Step S28 of FIG. 7, and then the process advances to Step S29.

As above, the decoding device 10 obtains the basic cycle of a block in which an error has occurred in a unit of blocks based on the correlation value of the waveform element of the block arranged immediately before the block in which an error has occurred and the waveform element of the block arranged n blocks before the above block. Accordingly, the above method is better because the amount of arithmetical operations for obtaining the basic cycle is smaller than the case where the basic cycle is obtained in a unit of sample. As a result, it is possible that a substitute waveform element may be generated from the waveform element of the past based on the basic cycle, and a substitute time series signal with little incompatibility caused by unpleasant strange noises is easily generated.

In addition, when there is deviation between the basic cycle and the cycle of a block and the evaluation value $EV(n_0)$ is lower than the threshold value $Ev_{TH}$, the decoding device 10 obtains the deviation amount using a time series signal, which has already been decoded, in the vicinity of a block which is a block arranged by the basic cycle $n_0$-number of blocks of a block unit in front. Therefore, it is possible to more correctly calculate a basic cycle at a relatively high speed.

Furthermore, the decoding device 10 obtains a correlation value $C_{n0/m}$ of a basic cycle $n_0/m$ of a block unit when the basic cycle $n_0$ of the block unit is greater than 2, and corrects the basic cycle $n_0$ of the block unit to the basic cycle $n_0/m$ of the block unit when the correlation value $C_{n0/m}$ is greater than the correlation value $C_{n0}$. Thus, it is possible to prevent integer multiple of an actual basic cycle from being calculated as a basic cycle of a block unit.

[Description of Computer to Which the Disclosure is Applied]

Next, a series of processes described above can be performed by hardware, and also by software. When the series of processes is performed by software, a program which constitutes the software is installed in a general-purpose computer, or the like.

Figure 9:
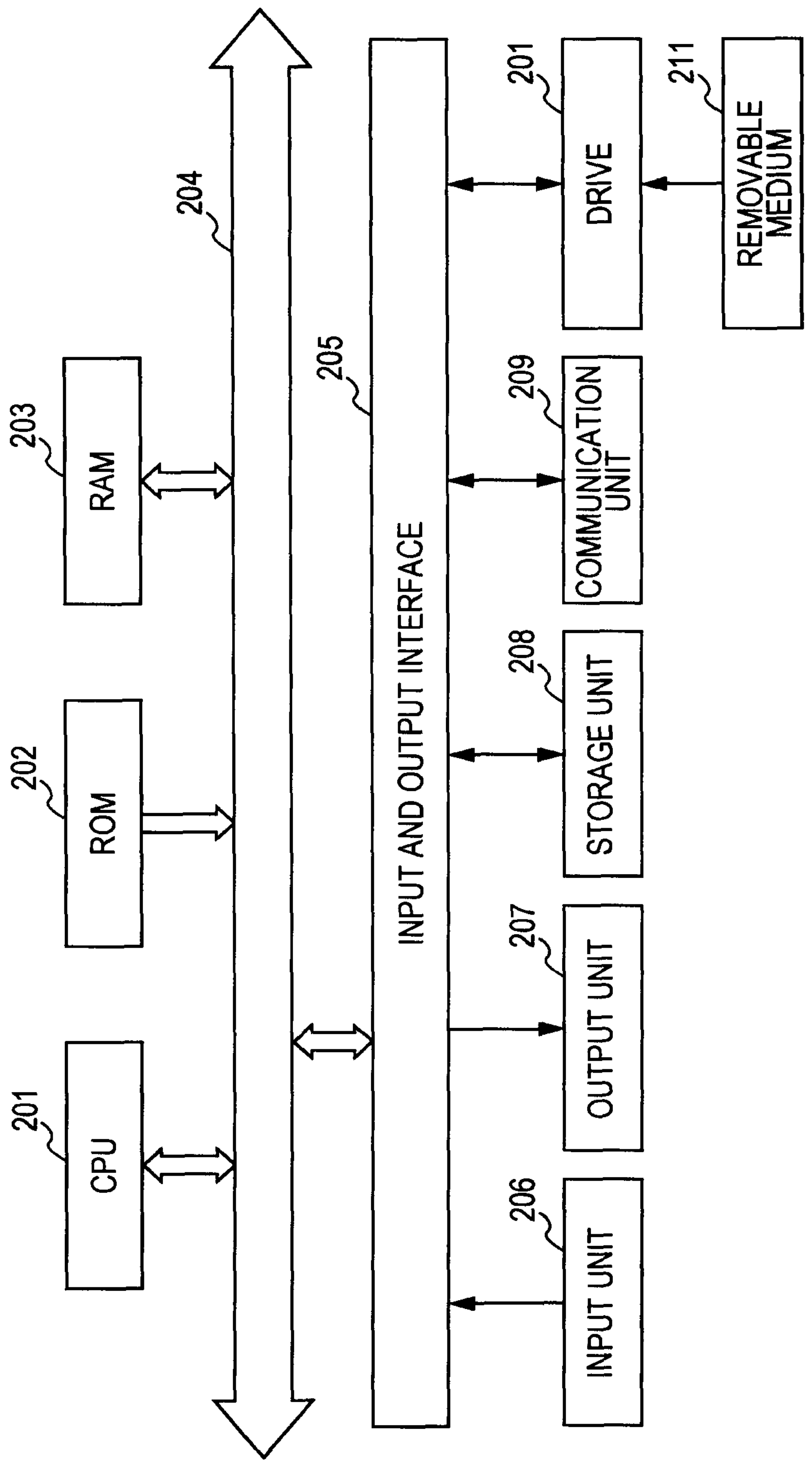
FIG. 9 is a block diagram showing a configuration example of an embodiment of a computer.

Hence, FIG. 9 shows a configuration example of an embodiment of a computer in which a program executing the above-described series of processes is installed.

The program can be recorded in a storage unit 208 or a ROM (Read Only Memory) 202 in advance as a recording medium mounted in the computer.

Alternatively, the program can be stored (recorded) in a removable medium 211. Such a removable medium 211 can be provided as so-called package software. Herein, as the removable medium 211, there are, for example, a flexible disk, a CD-ROM (Compact Disc Read Only Memory), an MO (Magneto Optical) disc, a DVD (Digital Versatile Disc), a magnetic disk, a semiconductor memory, and the like.

Furthermore, the program can be installed in the computer through a drive 210 from the above-described removable medium 211, or downloaded in the computer through a communication network or a broadcasting network, and installed in the internal storage unit 208. In other words, the program can be wirelessly transmitted to the computer, for example, through an artificial satellite for digital satellite broadcasting from a downloading site, or transmitted with wires to the computer through a network such as a LAN (Local Area Network), or the Internet.

The computer includes a CPU (Central Processing Unit) 201, and the CPU 201 is connected to an input and output interface 205 through a bus 204.

The CPU 201 executes programs stored in the ROM 202 according to an instruction when a user inputs such instruction by operating an input unit 206 through the input and output interface 205, or the like. Alternatively, the CPU 201 executes programs stored in the storage unit 208 by loading them in a RAM (Random Access Memory) 203.

Accordingly, the CPU 201 performs processes according to the above-described flowcharts, or processes according to the configurations of the above-described block diagrams. In addition, the CPU 201 causes an output unit 207 to perform outputting, a communication unit 209 to perform transmission, or the storage unit 208 to perform recording the results of the processes through, for example, the input and output interface 205 as necessity.

Furthermore, the input unit 206 includes a keyboard, a mouse, a microphone, or the like. In addition, the output unit 207 includes an LCD (Liquid Crystal Display), a speaker, or the like.

In the present specification here, processes performed by a computer with a program are not necessarily performed in time series in the order described in the flowcharts. In other words, the processes performed by a computer with a program include processes executed in parallel or individually (for example, parallel processes or processes by objects).

In addition, the program may perform processes using one computer (processor), or perform distributed processes using a plurality of computers. Furthermore, the program may be transmitted to and executed by a remote computer.

The present disclosure is particularly effective when the length of a block is relatively short.

The present disclosure contains subject matter related to that disclosed in Japanese Priority Patent Application JP 2010-263807 filed in the Japan Patent Office on Nov. 26, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A decoding device comprising:

a decoding unit which decodes encoded data obtained after audio signals of adjacent blocks are overlapped, undergo orthogonal transformation, and encoded;

an inverse orthogonal transformation unit which performs inverse orthogonal transformation for the encoded data that has been decoded by the decoding unit and obtains a time series waveform element in a unit of block;

a correlation calculation unit which obtains a correlation between a time series waveform element of a block arranged immediately before an error block which is a block in which an error has occurred during decoding by the decoding unit and a time series waveform element of a block arranged a predetermined number of blocks before the block;

a cycle calculation unit which obtains a basic cycle of a block unit of the error block based on the correlation obtained by the correlation calculation unit; and a generation unit which generates a substitute signal of the time series waveform element of the error block using the time series waveform element of the block arranged forward from the error block by a basic cycle of the block unit based on the basic cycle obtained by the cycle calculation unit.

2. The decoding device according to claim 1, wherein the cycle calculation unit calculates an evaluation value of the block arranged forward from the block immediately before the error block by the predetermined number of blocks for each of the predetermined number based on the correlation, and obtains the predetermined number when the evaluation value is at the maximum value as a basic cycle of the block unit.

3. The decoding device according to claim 2, further comprising:

a cycle adjustment unit which obtains a correlation between a time series waveform element of a block which is deviated by a predetermined number of samples from a block arranged forward from the block immediately before the error block by the predetermined number of blocks when the evaluation value is at the maximum value and the time series waveform element of the block immediately before the error block for the predetermined number of samples as deviation correlation when the maximum value of the evaluation value is smaller than a predetermined threshold value, and obtains the predetermined number of samples when the deviation correlation is at the maximum value as a deviation amount of a basic cycle of the error block for a cycle of the block in a case where the deviation correlation is greater than the correlation obtained by the correlation calculation unit, wherein the generation unit generates the substitute signal using a time series waveform element of a block arranged forward from the error block by the deviation amount and the basic cycle of the block unit based on the deviation amount and the basic cycle of the block unit when the deviation correlation is greater than the correlation obtained by the correlation calculation unit.

4. The decoding device according to claim 2, further comprising:

a cycle adjustment unit which obtains a correlation between the time series waveform element of the block arranged forward from the block immediately before the error block by 1/m (m is an integer equal to or higher than 2 and equal to or lower than the basic cycle of the block unit) times of the basic cycle of the block unit and the time series waveform element of the block immediately before the error block for each m as fractional correlation when the maximum value of the evaluation value is equal to or greater than a predetermined threshold value, and corrects the basic cycle of the block unit to the 1/m times when the fractional correlation is at the maximum value when the fractional correlation is greater than the correlation obtained by the correlation calculation unit, wherein the generation unit generates the substitute signal using the time series waveform element of the block arranged forward from the error block by the basic cycle based on the basic cycle of the block unit after the correction of the cycle adjustment unit when the fractional correlation is greater than the correlation obtained by the correlation calculation unit.

5. The decoding device according to claim 1, wherein the generation unit generates a substitute signal of a time series waveform element of a block next to the error block using a time series waveform element of a block next to the block arranged forward from the error block by the basic cycle of the block unit when an error occurs during decoding of the block next to the error block.

6. The decoding device according to claim 5, wherein the generation unit attenuates the substitute signal according to a period in which occurrence of the error continues.

7. The decoding device according to claim 1, further comprising:

an addition unit which adds the latter half of the time series waveform element of the block and the former half of a time series waveform element of a block arranged by one block after the block, the addition unit adds a substitute signal of the latter half of the time series waveform element of the error block and the former half of the time series waveform element of the block next to the error block obtained by the inverse orthogonal transformation unit when an error does not occur during decoding of the block next to the error block.

8. The decoding device according to claim 1 further comprising:

a storage unit which stores the time series waveform element obtained by the inverse orthogonal transformation unit.

9. The decoding device according to claim 8, wherein the storage unit stores the time series waveform element compressed in a predetermined compression form.

10. A decoding method by a decoding device comprising:
decoding encoded data obtained after audio signals of adjacent blocks are overlapped, undergo orthogonal transformation, and encoded;
performing inverse orthogonal transformation for the encoded data that has been decoded by the decoding of the encoded data to obtain a time series waveform element in a unit of block;
obtaining a correlation between a time series waveform element of a block arranged immediately before an error block which is a block in which an error has occurred during decoding by the decoding of the encoded data and a time series waveform element of a block arranged forward from the block by a predetermined number of blocks;
obtaining a basic cycle of a block unit of the error block based on the correlation obtained by the obtaining of the correlation; and
generating a substitute signal of the time series waveform element of the error block using the time series waveform element of the block arranged forward from the error block by a basic cycle of the block unit based on the basic cycle obtained by the obtaining of the basic cycle.

11. The decoding method according to claim 10, further comprising:
calculating an evaluation value of the block arranged forward from the block immediately before the error block by the predetermined number of blocks for each of the predetermined number based on the correlation; and
obtaining the predetermined number when the evaluation value is at the maximum value as a basic cycle of the block unit.

12. The decoding method according to claim 11, further comprising:
obtaining a correlation between a time series waveform element of a block which is deviated by a predetermined number of samples from a block arranged forward from the block immediately before the error block by the predetermined number of blocks when the evaluation value is at the maximum value and the time series waveform element of the block immediately before the error block for the predetermined number of samples as deviation correlation when the maximum value of the evaluation value is smaller than a predetermined threshold value; and
obtaining the predetermined number of samples when the deviation correlation is at the maximum value as a deviation amount of a basic cycle of the error block for a cycle of the block in a case where the deviation correlation is greater than the obtained correlation between the time series waveform element of the block arranged immediately before the error block and the time series waveform element of the block arranged the predetermined number of blocks before the block,
wherein the substitute signal is generated using a time series waveform element of a block arranged forward from the error block by the deviation amount and the basic cycle of the block unit based on the deviation amount and the basic cycle of the block unit when the deviation correlation is greater than the obtained correlation between the time series waveform element of the block arranged immediately before the error block and the time series waveform element of the block arranged the predetermined number of blocks before the block.

13. The decoding method according to claim 11, further comprising:
obtaining a correlation between the time series waveform element of the block arranged forward from the block immediately before the error block by 1/m (m is an integer equal to or higher than 2 and equal to or lower than the basic cycle of the block unit) times of the basic cycle of the block unit and the time series waveform element of the block immediately before the error block for each m as fractional correlation when the maximum value of the evaluation value is equal to or greater than a predetermined threshold value; and
correcting the basic cycle of the block unit to the 1/m times when the fractional correlation is at the maximum value when the fractional correlation is greater than the obtained correlation between the time series waveform element of the block arranged immediately before the error block and the time series waveform element of the block arranged the predetermined number of blocks before the block,
wherein the substitute signal is generated using the time series waveform element of the block arranged forward from the error block by the basic cycle based on the basic cycle of the block unit after the correction of the basic cycle of the block unit when the fractional correlation is greater than the obtained correlation between the time series waveform element of the block arranged immediately before the error block and the time series waveform element of the block arranged the predetermined number of blocks before the block.

14. The decoding method according to claim 10, further comprising:
generating a substitute signal of a time series waveform element of a block next to the error block using a time series waveform element of a block next to the block arranged forward from the error block by the basic cycle of the block unit when an error occurs during decoding of the block next to the error block.

15. The decoding method according to claim 14, wherein the substitute signal is attenuated according to a period in which occurrence of the error continues.

16. The decoding method according to claim 10, further comprising:
adding the latter half of the time series waveform element of the block and the former half of a time series waveform element of a block arranged by one block after the block,
wherein a substitute signal of the latter half of the time series waveform element of the error block and the former half of the time series waveform element of the block next to the obtained error block are added when an error does not occur during decoding of the block next to the error block.

17. The decoding method according to claim 10 further comprising:
storing the time series waveform element obtained by the performed inverse orthogonal transformation.

18. The decoding method according to claim 17, wherein the time series waveform element is stored in a predetermined compression form.

19. A non-transitory computer-readable medium having embodied thereon a program, which when executed by a computer causes the computer to perform a method, the method comprising:
decoding encoded data obtained after audio signals of adjacent blocks are overlapped, undergo orthogonal transformation, and encoded;

performing inverse orthogonal transformation for the encoded data that has been decoded by the decoding of the encoded data to obtain a time series waveform element in a unit of block;

obtaining a correlation between a time series waveform element of a block arranged immediately before an error block which is a block in which an error has occurred during decoding by the decoding of the encoded data and a time series waveform element of a block arranged forward from the block by a predetermined number of blocks;

obtaining a basic cycle of a block unit of the error block based on the correlation obtained by the obtaining of the correlation; and generating a substitute signal of the time series waveform element of the error block using the time series waveform element of the block arranged forward from the error block by a basic cycle of the block unit based on the basic cycle obtained by the obtaining of the basic cycle.

20. The non-transitory computer-readable medium according to claim 19, wherein the performed method further comprises:

calculating an evaluation value of the block arranged forward from the block immediately before the error block by the predetermined number of blocks for each of the predetermined number based on the correlation; and obtaining the predetermined number when the evaluation value is at the maximum value as a basic cycle of the block unit.

* * * * *